United States Patent
Gadinski et al.

(10) Patent No.: US 10,569,384 B1
(45) Date of Patent: *Feb. 25, 2020

(54) CHEMICAL MECHANICAL POLISHING PAD AND POLISHING METHOD

(71) Applicant: Rohm and Haas Electronic Materials CMP Holdings, Inc., Newark, DE (US)

(72) Inventors: Matthew R. Gadinski, Newark, DE (US); Mohammad T. Islam, New Castle, DE (US); Yi Guo, Newark, DE (US); George C. Jacob, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/182,168

(22) Filed: Nov. 6, 2018

(51) Int. Cl.

| | |
|---|---|
| *H01L 21/687* | (2006.01) |
| *B24B 37/24* | (2012.01) |
| *H01L 21/306* | (2006.01) |
| *H01L 21/3105* | (2006.01) |
| *C09G 1/02* | (2006.01) |
| *C08G 18/48* | (2006.01) |
| *C08G 18/32* | (2006.01) |
| *C08G 18/66* | (2006.01) |
| *C08G 18/76* | (2006.01) |
| *C08G 18/18* | (2006.01) |
| *C08G 18/10* | (2006.01) |
| *H01L 21/768* | (2006.01) |
| *H01L 21/321* | (2006.01) |

(52) U.S. Cl.
CPC .............. *B24B 37/24* (2013.01); *C08G 18/10* (2013.01); *C08G 18/1875* (2013.01); *C08G 18/3243* (2013.01); *C08G 18/4854* (2013.01); *C08G 18/6685* (2013.01); *C08G 18/7664* (2013.01); *C09G 1/02* (2013.01); *H01L 21/30625* (2013.01); *H01L 21/31053* (2013.01); *H01L 21/3212* (2013.01); *H01L 21/7684* (2013.01)

(58) Field of Classification Search
None
See application file for complete search history.

(56) References Cited

U.S. PATENT DOCUMENTS

| | | | |
|---|---|---|---|
| 6,638,143 | B2 | 10/2003 | Wang et al. |
| 7,001,252 | B2 | 2/2006 | Hasegawa et al. |
| 9,127,187 | B1 * | 9/2015 | Grumbine ................ C09G 1/02 |
| 9,484,212 | B1 | 11/2016 | Qian et al. |
| 2007/0037491 | A1 | 2/2007 | Li et al. |
| 2017/0120416 | A1 | 5/2017 | Chockalingam et al. |
| 2019/0232460 | A1 * | 8/2019 | Takegoshi ............. B24B 37/044 |

FOREIGN PATENT DOCUMENTS

| | | |
|---|---|---|
| JP | 2009262303 | 11/2009 |
| WO | WO2017138564 A1 | 8/2017 |
| WO | 2018021428 | 2/2018 |

OTHER PUBLICATIONS

Copending U.S. Appl. No. 16/182,133.

* cited by examiner

*Primary Examiner* — Allan W. Olsen
(74) *Attorney, Agent, or Firm* — Simon L. Xu

(57) ABSTRACT

The present invention concerns a chemical mechanical polishing pad having a polishing layer that possesses a consistent positive zeta potential across the entire surface. Also disclosed is a chemical mechanical polishing method using the polishing pad together with a positively charged slurry.

10 Claims, No Drawings

CHEMICAL MECHANICAL POLISHING PAD AND POLISHING METHOD

The present invention relates generally to the field of chemical mechanical polishing (CMP) of advanced semiconductor devices. More particularly, the present invention is directed to a chemically modified CMP pad, and a method of chemical mechanical polishing of advanced semiconductor devices.

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a chemical composition ("slurry") or other polishing solution is provided between the wafer and the polishing pad. Thus, the wafer surface is polished and made planar by the chemical and mechanical action of the pad surface and slurry.

In addition to the contact force between a pad and slurry particles, surface forces also act between the wafer and the slurry particles, and impact the CMP material removal rate.

US Patent Application Publication No. 2017/0120416 discloses polishing articles having varying regions of zeta potential throughout the surface of the polishing articles. When an active slurry contains an abrasive having a positive zeta potential (e.g., alumina), the polishing surface may be designed to have a more negative zeta potential relative to other regions of the surface of the polishing article to attract the abrasive to the interface between the polishing article and the liquid interface.

U.S. Pat. No. 9,484,212 discloses a method for improving the removal rate selectivity between a silicon oxide material and a silicon nitride for a polishing layer in a CMP pad. This is achieved by certain combinations of the raw materials used in the polishing layer composition together with using a silica abrasive that has a positive surface charge measured at a polishing pH of 1 to 6.

WO2018021428 discloses polishing pads having positive zeta potentials. The polishing pads are made of a tertiary amine polyurethane.

A need exists for an improved chemical mechanical polishing pad having higher CMP planarization performance and productivity. The present invention satisfies this need by providing a chemically modified CMP pad having a consistent positive zeta potential across the entire surface, and a method of pairing the improved pad with a positively charged slurry to improve polishing performance.

SUMMARY OF THE DISCLOSURE

An embodiment provides a chemical mechanical (CMP) polishing pad having a positive zeta potential for polishing a substrate chosen from at least one of a memory, a silicon disk, glass, and a semiconductor substrate, the polishing pad comprising a polishing layer having a composition and a polishing surface, wherein the composition is a reaction product of ingredients, comprising:
(a) a polyfunctional isocyanate having an average of at least two unreacted isocyanate (NCO) groups per molecule;
(b) a first curative consisting of a hydroxyl substituted quaternary ammonium;
(c) a second curative, wherein said second curative is free of quaternary ammonium; and
(d) optionally, a plurality of microelements;
wherein said first curative is present at equal to or greater than 50 mol % based on the total molar amount of the first curative and the second curative, and wherein the stoichiometric ratio of the combined reactive hydrogen groups in the curatives of (b) and (c) to the at least two unreacted isocyanate (NCO) groups in the polyfunctional isocyanate of (a) is 0.8 to 1.1; and
wherein said positive zeta potential is consistent across the surface of the entire polishing pad, and is independent of pH over a pH range of from 2 to 12 using nitric acid or potassium hydroxide to adjust pH of deionized water.

Another embodiment provides that the quaternary ammonium contains at least two hydroxyl groups per molecule.

Another embodiment provides that the quaternary ammonium contains at least three hydroxyl groups per molecule.

Another embodiment provides that the second curative comprises an amine.

Another embodiment provides that the second curative contains less than 0.1 wt % of tertiary amine.

Another embodiment provides that the amine is an aromatic amine.

Another embodiment provides that the aromatic amine is 4,4'-methylenebis(2-chloroaniline) (MBOCA).

Another embodiment provides that the quaternary ammonium is tris(2-hydroxyethyl)methylammonium methylsulfate.

Another embodiment provides that the quaternary ammonium is (2,3-dihydroxypropyl)trimethylammonium chloride.

Another embodiment provides that the zeta potential is in the range of +90 to +160 mV.

Another embodiment provides a method of chemical mechanical polishing a substrate, comprising:
providing the substrate;
providing a polishing slurry comprising water and a silica abrasive;
providing a chemical mechanical polishing pad having a positive zeta potential, the polishing pad comprising a polishing layer having a composition, and a polishing surface, wherein the composition is a reaction product of ingredients, comprising:
(a) a polyfunctional isocyanate having an average of at least two unreacted isocyanate (NCO) groups per molecule;
(b) a first curative consisting of a hydroxyl substituted quaternary ammonium;

(c) a second curative, wherein said second curative is free of quaternary ammonium; and, (d) optionally, a plurality of microelements;

wherein said first curative is present at equal to or greater than 50 mol % based on the total molar amount of the first curative and the second curative, and wherein the stoichiometric ratio of the combined reactive hydrogen groups in the curatives of (b) and (c) to the at least two unreacted isocyanate (NCO) groups in the polyfunctional isocyanate of (a) is 0.8 to 1.1; and wherein said positive zeta potential is consistent across the surface of the entire polishing pad and is independent of pH over a pH range of 2 to 12 using nitric acid or potassium hydroxide to adjust pH of deionized water;

creating a dynamic motion between the polishing surface and the substrate to polish a surface of the substrate; and dispensing the polishing slurry onto the chemical mechanical polishing pad at or near the interface between the polishing surface and the substrate.

Another embodiment provides that the silica abrasive has a positive surface charge measured at a polishing pH of 1 to 6.

Yet another embodiment provides that the polishing slurry has a pH of 3-5.

These and other features and advantages of the present embodiments will be more readily understood by those of ordinary skill in the art from a reading of the following Detailed Description. Certain features of the disclosed embodiments which are, for clarity, described above and below as separate embodiments, may also be provided in combination in a single embodiment. Conversely, various features of the disclosed embodiments that are described in the context of a single embodiment, may also be provided separately or in any subcombination.

DETAILED DESCRIPTION

Unless otherwise stated or defined, all technical and scientific terms used herein have commonly understood meanings by one of ordinary skill in the art to which this disclosure pertains.

Unless stated otherwise, all percentages, parts, ratios, etc., are by weight.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range.

Unless otherwise indicated, conditions of temperature and pressure are ambient temperature and standard pressure. All ranges recited are inclusive and combinable.

Unless otherwise indicated, any term containing parentheses refers, alternatively, to the whole term as if no parentheses were present and the term without them, and combinations of each alternative. Thus, the term "(poly) isocyanate" refers to isocyanate, polyisocyanate, or mixtures thereof.

As used herein, the term "ASTM" refers to publications of ASTM International, West Conshohocken, Pa.

As used herein, unless otherwise indicated, the term "molecular weight" or "average molecular weight" means a formula weight for a given material as reported by its manufacturer. An average molecular weight refers to the molecular weight reported for a distribution of molecules in a given material, e.g. a polymer distribution.

As used herein, the term "stoichiometry" of a reaction mixture refers to the ratio of molar equivalents of NCO groups to the number of molar equivalents of OH groups in a given reaction mixture.

As used herein, the term "polyisocyanate" means any isocyanate group containing molecule having three or more isocyanate groups, including blocked isocyanate groups.

As used herein, the term "polyurethanes" refers to polymerization products from difunctional or polyfunctional isocyanates, e.g. polyetherureas, polyisocyanurates, polyurethanes, polyureas, polyurethaneureas, copolymers thereof and mixtures thereof.

As used herein, the term "reaction mixture" includes any non-reactive additives, such as microelements and any additives to lower wet hardness (Shore D or Shore A according to ASTM D2240-15 (2015)) of a polyurethane reaction product in the polishing pad.

As used herein, the term "semiconductor wafer" is intended to encompass a semiconductor substrate, such as an unpatterned semiconductor or one having a pattern, a semiconductor device, various packages for various levels of interconnection, including a single-chip wafer or a multiple-chip wafer, a substrate for a light emitting diode (LED), or other assemblies requiring solder connections.

As used herein, the term "semiconductor substrate" is defined to mean any construction comprising semiconductive material. A semiconductor substrate includes semiconductor devices and any substrate having one or more semiconductor layers or structures which include active or operable portions of semiconductor devices.

As used herein, the term "semiconductor device" refers to a semiconductor substrate upon which at least one microelectronic device has been or is being fabricated.

As used herein, the terms "Shore D hardness" and "Shore A hardness" are the hardness values of a given material as measured after a given time period according to ASTM D2240-15 (2015), "Standard Test Method for Rubber Property—Durometer Hardness". Hardness was measured on a Rex Hybrid hardness tester (Rex Gauge Company, Inc., Buffalo Grove, Ill.), equipped, respectively, with a D or A probe. Four samples were stacked and shuffled for each hardness measurement; and each specimen tested was conditioned by placing it in 50 percent relative humidity for five days at 23° C. before testing and using methodology outlined in ASTM D2240-15 (2015) to improve the repeatability of the hardness tests.

As used herein, the term "SG" or "specific gravity" refers to the weight/volume ratio of a rectangular cut out of a polishing pad or layer in accordance with the present invention.

As used herein, the term "MBOCA" means 4,4'-methylenebis(2-chloroaniline), a commercially available aniline.

As used herein, the term "MCDEA" means bis(4-amino-2-chloro-3,5-diethylphenyl)methane, a commercially available aniline.

As used herein, the term "MTEOA MeOSO3" means tris(2-hydroxyethyl)methylammonium methylsulfate, or Basionic FS-01 or Efka® 106783, a commercially available quaternary ammonium from BASF.

Unless otherwise noted, the above chemicals were obtained from Aldrich (Milwaukee, Wis.) or other similar suppliers of laboratory chemicals.

In addition, references in the singular may also include the plural (for example, "a" and "an" may refer to one, or one or more) unless the context specifically states otherwise.

It has surprisingly been found that blending at least 50 mol % (based on total molar amount of curatives) of a hydroxyl substituted quaternary ammonium as a curative to react with a polyfunctional isocyanate having at least two unreacted isocyanate (NCO) groups per molecule result in a polyurethane polishing layer having positive zeta potential across the entire surface, and that the positive zeta potential on the surface of the polishing layer is not affected by pH. As semiconductor substrates continue to evolve with increasing complexity, a need persists for CMP pads with better features that can afford better removal rate. The CMP pad provided by the present invention offers another tool for achieving better removal rate to enable the manufacture of ever more complex substrates. Suitable substrates for the present invention include, but are not limited to, memory, silicon disk, glass, semiconductor wafer, and semiconductor substrate.

The polishing layer composition of the polishing layer in the chemical mechanical polishing pad provided in the present invention is a polyurethane reaction product of ingredients, comprising: (a) a polyfunctional isocyanate having an average of at least two unreacted isocyanate (NCO) groups per molecule; (b) a first curative consisting of a hydroxyl substituted quaternary ammonium; (c) a second curative, wherein said second curative is free of quaternary ammonium; and (d) optionally, a plurality of microelements; wherein said first curative is present at equal to or greater than 50 mol % (more preferably greater than 55 mol %; most preferably between 60 mol % and 75 mol %) based on the total molar amount of the first curative and the second curative, and wherein the stoichiometric ratio of the combined reactive hydrogen groups in the curatives of (b) and (c) to the at least two unreacted isocyanate (NCO) groups in the polyfunctional isocyanate of (a) is 0.8 to 1.1; and wherein said positive zeta potential is consistent across the surface of the entire polishing pad, and is independent of pH over a pH range of from 2 to 12 (more preferably, 3 to 8; most preferably 4 to 6) using nitric acid or potassium hydroxide to adjust pH of deionized water.

Preferably, the polyfunctional isocyanate having an average of at least two unreacted isocyanate (NCO) groups per molecule is a reaction product of ingredients, including: (i) an aliphatic polyfunctional isocyanate; and, (ii) a prepolymer polyol. More preferably, the polyfunctional isocyanate having an average of at least two unreacted isocyanate (NCO) groups per molecule is a reaction product of ingredients, including: (i) an aliphatic polyfunctional isocyanate, wherein the aliphatic polyfunctional isocyanate is selected from the group consisting of isophorone diisocyanate (IPDI); hexamethylene-1,6-diisocyanate (HDI), 4,4-methylenebis(cyclohexyl isocyanate) ($H_{12}$MDI), 1,4-cyclohexane diisocyanate; 1,3-cyclohexane diisocyanate; 1,2-cyclohexane diisocyanate; 2,2,4-trimethylhexamethylene diisocyanate; 2,4,4-trimethylhexamethylene diisocyanate; 1,4-bis(isocyanatomethyl) cyclohexane; 1,3-bis(isocyanatomethyl) cyclohexane and mixtures thereof; and, (ii) a prepolymer polyol, wherein the prepolymer polyol is selected from the group consisting of diols, polyols, polyol diols, copolymers thereof, and mixtures thereof. Still more preferably, the polyfunctional isocyanate having an average of at least two unreacted isocyanate (NCO) groups per molecule is a reaction product of ingredients, including: (i) an aliphatic polyfunctional isocyanate, wherein the aliphatic polyfunctional isocyanate is 4,4-methylenebis(cyclohexyl isocyanate) ($H_{12}$-MDI); and, (ii) a prepolymer polyol, wherein the prepolymer polyol is selected from the group consisting of diols, polyols, polyol diols, copolymers thereof, and mixtures thereof.

Preferably, the prepolymer polyol is selected from the group consisting of polyether polyols (e.g., poly(oxytetramethylene)glycol, poly(oxypropylene)glycol, poly(oxyethylene)glycol); polycarbonate polyols; polyester polyols; polycaprolactone polyols; mixtures thereof; and, mixtures thereof with one or more low molecular weight polyols selected from the group consisting of ethylene glycol; 1,2-propylene glycol; 1,3-propylene glycol; 1,2-butanediol, 1,3-butanediol, 2-methyl-1,3-propanediol, 1,4-butanediol, neopentyl glycol; 1,5-pentanediol, 3-methyl-1,5-pentanediol, 1,6-hexanediol, diethylene glycol; dipropylene glycol; and, tripropylene glycol. More preferably, the prepolymer polyol is selected from the group consisting of at least one of polytetramethylene ether glycol (PTMEG); polypropylene ether glycols (PPG), and polyethylene ether glycols (PEG); optionally, mixed with at least one low molecular weight polyol selected from the group consisting of ethylene glycol; 1,2-propylene glycol; 1,3-propylene glycol; 1,2-butanediol, 1,3-butanediol, 2-methyl-1,3-propanediol, 1,4-butanediol, neopentyl glycol; 1,5-pentanediol, 3-methyl-1,5-pentanediol, 1,6-hexanediol, diethylene glycol; dipropylene glycol; and, tripropylene glycol.

Preferably, the polyfunctional isocyanate having an average of at least two unreacted isocyanate (NCO) groups per molecule is an isocyanate terminated urethane prepolymer having 5.5 to 11.5 wt % (preferably, 6 to 11 wt %; more preferably, 7 to 10.5 wt %; most preferably, 7.25 to 10.5 wt %) unreacted isocyanate (NCO) groups.

Preferably, the first curative, the quaternary ammonium curative, contains two hydroxyl groups per molecule. More preferably, the quaternary ammonium curative contains three hydroxyl groups per molecule. Preferably, the quaternary ammonium curative contains a halide, sulfate or nitrate as the counterion. Preferably, the quaternary ammonium curative has a molecular weight in the range of 100-500 g/mol. Examples of commercially available quaternary ammonium curatives include Basionic FS-01, or tris(2-hydroxyethyl)methylammonium methylsulfate, from BASF, (2,3-dihydroxypropyl)trimethylammonium chloride, and dodecyl bis(2-hydroxyethyl)methylammonium chloride.

Preferably, the second curative, is an amine. More preferably, the second curative contains less than 0.1 wt % of tertiary amine. Most preferably, the second curative is an aromatic amine. Preferably, the second curative has a molecular weight in the range of 100-500 g/mol. Examples of commercially available aromatic amine curative include MBOCA, and MCDEA.

The second curative also includes aliphatic-amine initiated polyol curatives, e.g., Voranol 800, an aliphatic-amine initiated polyether polyol curative.

Preferably, the first curative is present at equal to or greater than 50 mol % (more preferably greater than 55 mol %; most preferably between 60 mol % and 75 mol %) based on the total molar amount of the first curative and the second curative, and wherein the stoichiometric ratio of the combined reactive hydrogen groups in the curatives to the at least two unreacted isocyanate (NCO) groups in the polyfunctional isocyanate of (a) is 0.8 to 1.1. The presence of the first curative in quantities disclosed above allows for the formation of a polishing layer that has consistent positive zeta potential across the entire surface. Outside of the range disclosed, insufficient amounts of the first curative cause the zeta potential to vary from location to location in the polishing layer, whereas excessive amounts of the first curative cause material phase separation in the polishing layer.

Preferably, the plurality of microelements is selected from entrapped gas bubbles, hollow core polymeric materials, water soluble materials and an insoluble phase material (e.g., mineral oil). More preferably, the plurality of microelements is selected from entrapped gas bubbles and hollow core polymeric materials. Preferably, the plurality of microelements has a weight average diameter of less than 150 μm (more preferably of less than 50 μm; most preferably of 10 to 50 μm). Preferably, the plurality of microelements comprise polymeric microballoons with shell walls of either polyacrylonitrile or a polyacrylonitrile copolymer (e.g., Expancel® from Akzo Nobel). Preferably, the plurality of microelements is incorporated into the polishing layer composition at 0 to 35 vol % porosity (more preferably 10 to 25 vol % porosity). Preferably, the plurality of microelements is distributed throughout the polishing layer composition.

The method of chemical mechanical polishing a substrate of the present invention, comprises: providing the substrate; providing a polishing slurry comprising water and a silica abrasive; providing a chemical mechanical polishing pad having a positive zeta potential, the polishing pad comprising a polishing layer having a composition, and a polishing surface, wherein the composition is a reaction product of ingredients, comprising: (a) a polyfunctional isocyanate having an average of at least two unreacted isocyanate (NCO) groups per molecule; (b) a first curative consisting of a hydroxyl substituted quaternary ammonium; (c) a second curative, wherein said second curative is free of quaternary ammonium; and, (d) optionally, a plurality of microelements; wherein said first curative is present at equal to or greater than 50 mol % based on the total molar amount of the first curative and the second curative, and wherein the stoichiometric ratio of the combined reactive hydrogen groups in the curatives of (b) and (c) to the at least two unreacted isocyanate (NCO) groups in the polyfunctional isocyanate of (a) is 0.8 to 1.1; and wherein the positive zeta potential is consistent across the surface of the entire polishing pad and is independent of pH over a pH range of 2 to 12 using nitric acid or potassium hydroxide to adjust pH of deionized water; creating a dynamic motion between the polishing surface and the substrate to polish a surface of the substrate; and dispensing the polishing slurry onto the chemical mechanical polishing pad at or near the interface between the polishing surface and the substrate.

Preferably, in the method of chemical mechanical polishing a substrate of the present invention, the substrate provided comprises a silicon oxide. More preferably, in the method of chemical mechanical polishing a substrate of the present invention, the substrate provided is a semiconductor substrate comprising a silicon oxide. Even more preferably, in the method of chemical mechanical polishing a substrate of the present invention, the substrate provided is a semiconductor substrate comprising a silicon oxide and a silicon nitride. Most preferably, in the method of chemical mechanical polishing a substrate of the present invention, the substrate provided is a semiconductor substrate comprising at least one silicon oxide feature and at least one silicon nitride feature; wherein the at least one silicon oxide feature and the at least one silicon nitride feature are exposed to the polishing surface and the polishing slurry during the chemical mechanical polishing; and, wherein at least some of the at least one silicon oxide feature and the at least one silicon nitride feature is removed from the substrate.

Preferably, in the method of chemical mechanical polishing a substrate of the present invention, the polishing slurry provided, comprises: water and a silica abrasive; wherein the silica abrasive has a positive surface charge measured at a polishing pH of 1 to 6 (preferably, 2 to 5; more preferably, 2.5 to 5; most preferably, 2.75 to 4.75). More preferably, in the method of chemical mechanical polishing a substrate of the present invention, the polishing slurry provided, comprises: water; and, 0.1 to 6 wt % of a silica abrasive; wherein the silica abrasive has a positive surface charge measured at a polishing pH of 1 to 6 (preferably, 2 to 5; more preferably, 2.5 to 5; most preferably, 2.75 to 4.75). Still more preferably, in the method of chemical mechanical polishing a substrate of the present invention, the polishing slurry provided, comprises: water; and, 0.5 to 5 wt % of a silica abrasive; wherein the silica abrasive has a positive surface charge measured at a polishing pH of 1 to 6 (preferably, 2 to 5; more preferably, 2.5 to 5; most preferably, 2.75 to 4.75). Most preferably, in the method of chemical mechanical polishing a substrate of the present invention, the polishing slurry provided, comprises: water; and, 0.75 to 2 wt % of a silica abrasive; wherein the silica abrasive has a positive surface charge measured at a polishing pH of 1 to 6 (preferably, 2 to 5; more preferably, 2.5 to 5; most preferably, 2.75 to 4.75).

Preferably, in the method of chemical mechanical polishing a substrate of the present invention, the water contained in the polishing slurry provided is at least one of deionized and distilled to limit incidental impurities.

Preferably, in the method of chemical mechanical polishing a substrate of the present invention, the silica abrasive contained in the polishing slurry provided is a colloidal silica abrasive; wherein the colloidal silica abrasive has a positive surface charge measured at a polishing pH of 1 to 6 (preferably, 2 to 5; more preferably, 2.5 to 5; most preferably, 2.75 to 4.75). More preferably, in the method of chemical mechanical polishing a substrate of the present invention, the silica abrasive contained in the polishing slurry provided is a colloidal silica abrasive having an average particle size of 100 nm as measured by dynamic light scattering techniques; wherein the colloidal silica abrasive has a positive surface charge measured at a polishing pH of 1 to 6 (preferably, 2 to 5; more preferably, 2.5 to 5; most preferably, 2.75 to 4.75). Most preferably, in the method of chemical mechanical polishing a substrate of the present invention, the silica abrasive contained in the polishing slurry provided is a colloidal silica abrasive having an average particle size of 5 to 100 nm (more preferably, 10 to 60 nm; most preferably, 20 to 60 nm) as measured by dynamic light scattering techniques; wherein the colloidal silica abrasive has a positive surface charge measured at a polishing pH of 1 to 6 (preferably, 2 to 5; more preferably, 2.5 to 5; most preferably, 2.75 to 4.75).

Preferably, in the method of chemical mechanical polishing a substrate of the present invention, the polishing slurry provided has a polishing pH of 1 to 6. More preferably, in the method of chemical mechanical polishing a substrate of the present invention, the polishing slurry provided has a polishing pH of 2 to 5. Still more preferably, in the method of chemical mechanical polishing a substrate of the present invention, the polishing slurry provided has a polishing pH of 2.5 to 5. Most preferably, in the method of chemical mechanical polishing a substrate of the present invention, the polishing slurry provided has a polishing pH of 2.75 to 4.75.

Preferably, in the method of chemical mechanical polishing a substrate of the present invention, the polishing slurry provided further comprises an additional additive selected from the group consisting of dispersants, surfactants, buffers, anti-foaming agents and biocides.

Preferably, the polishing surface is adapted for polishing the substrate by imparting the polishing surface with a macrotexture. More preferably, the polishing surface is adapted for polishing the substrate by imparting the polishing surface with a macrotexture, wherein the macrotexture is selected from at least one of perforations and grooves. Perforations can extend from the polishing surface part way or all the way through a thickness of the polishing layer. Preferably, grooves are arranged on the polishing surface such that upon rotation of the chemical mechanical polishing pad during polishing, at least one groove sweeps over the surface of the substrate being polished. Preferably, the polishing surface has macrotexture including at least one groove selected from the group consisting of curved grooves, linear grooves and combinations thereof.

Preferably, the polishing surface is adapted for polishing the substrate by imparting the polishing surface with a macrotexture, wherein the macrotexture comprises a groove pattern formed in the polishing layer at the polishing surface. Preferably, the groove pattern comprises a plurality of grooves. More preferably, the groove pattern is selected from a groove design. Preferably, the groove design is selected from the group consisting of concentric grooves (which may be circular or spiral), curved grooves, cross hatch grooves (e.g., arranged as an X-Y grid across the pad surface), other regular designs (e.g., hexagons, triangles), tire tread type patterns, irregular designs (e.g., fractal patterns), and combinations thereof. More preferably, the groove design is selected from the group consisting of random grooves, concentric grooves, spiral grooves, cross-hatched grooves, X-Y grid grooves, hexagonal grooves, triangular grooves, fractal grooves and combinations thereof. Most preferably, the polishing surface has a spiral groove pattern formed therein. The groove profile is preferably selected from rectangular with straight side walls or the groove cross section may be "V" shaped, "U" shaped, saw tooth, and combinations thereof.

Preferably, the chemical mechanical polishing pad provided in the method of the present invention has a polishing layer with an average thickness of 20 to 150 mils (more preferably 30 to 125 mils; most preferably 40 to 120 mils).

The chemical mechanical polishing pad provided in the method of the present invention has a polishing layer that can be provided in both porous and nonporous (i.e., unfilled) configurations. Preferably, the chemical mechanical polishing pad provided in the method of the present invention has a polishing layer with a density of 0.6 g/cm$^3$ as measured according to ASTM D1622. More preferably, in the chemical mechanical polishing pad provided in the method of the present invention has a polishing layer with a density of 0.7 to 1.1 g/cm$^3$ (more preferably, 0.75 to 1.0; most preferably, 0.75 to 0.95) as measured according to ASTM D1622.

Preferably, the chemical mechanical polishing pad provided in the method of the present invention has a polishing layer with a Shore D hardness of 10 to 60 as measured according to ASTM D2240. More preferably, the chemical mechanical polishing pad provided in the method of the present invention has a polishing layer with a Shore D hardness of 15 to 50 (most preferably 20 to 40) as measured according to ASTM D2240.

Preferably, the chemical mechanical polishing pad provided in the method of the present invention has a polishing layer with an elongation to break of 100 to 500% (more preferably, 200 to 450%; most preferably, 300 to 400%) as measured according to ASTM D412.

Preferably, the chemical mechanical polishing pad provided in the method of the present invention has a polishing layer with a toughness of 10 to 50 MPa (more preferably, 15 to 40 MPa; most preferably, 20 to 30 MPa) as measured according to ASTM D1708-10.

Preferably, the chemical mechanical polishing pad provided in the method of the present invention has a polishing layer with a tensile strength of 5 to 35 MPa (more preferably, 7.5 to 20 MPa; most preferably, 10 to 15 MPa) as measured according to ASTM D1708-10.

Preferably, the chemical mechanical polishing pad provided in the method of the present invention is adapted to be interfaced with a platen of a polishing machine. More preferably, the chemical mechanical polishing pad provided in the method of the present invention is adapted to be affixed to the platen of a polishing machine. Most preferably, the chemical mechanical polishing pad provided in the method of the present invention is designed to be affixed to the platen using at least one of a pressure sensitive adhesive and vacuum. Preferably, the chemical mechanical polishing pad provided in the method of the present invention further comprises a platen adhesive, wherein the platen adhesive is disposed on a side of the chemical mechanical polishing pad opposite the polishing surface.

Preferably, the chemical mechanical polishing pad provided in the method of the present invention further comprises at least one additional layer interfaced with the polishing layer. Preferably, the chemical mechanical polishing pad provided in the method of the present invention further comprises a compressible base layer adhered to the polishing layer. The compressible base layer preferably improves conformance of the polishing layer to the surface of the substrate being polished. Preferably, the compressible base layer is adhered to the polishing layer via a stack adhesive interposed between the compressible base layer and the polishing layer. Preferably, the stack adhesive is selected from the group consisting of a pressure sensitive adhesive, a hot melt adhesive, a contact adhesive and combinations thereof. More preferably, the stack adhesive is selected from the group consisting of a pressure sensitive adhesive and a hot melt adhesive. Most preferably, the stack adhesive is a reactive hot melt adhesive.

An important step in substrate polishing operations is determining an endpoint to the process. One popular in situ method for endpoint detection involves providing a polishing pad with a window, which is transparent to select wavelengths of light. During polishing, a light beam is directed through the window to the wafer surface, where it reflects and passes back through the window to a detector (e.g., a spectrophotometer). Based on the return signal, properties of the substrate surface (e.g., the thickness of films thereon) can be determined for endpoint detection. To facilitate such light based endpoint methods, the chemical mechanical polishing pad provided in the method of the present invention, optionally further comprises an endpoint detection window. Preferably, the endpoint detection window is selected from an integral window incorporated into the polishing layer; and, a plug in place endpoint detection window block incorporated into the chemical mechanical polishing pad provided.

Preferably, the method of chemical mechanical polishing a substrate of the present invention, further comprises: providing a polishing machine having a rotating platen, a rotating head and a rotating conditioner; wherein the polishing layer is mounted to the rotating platen; wherein the substrate is secured to the rotating head; wherein the rotating platen is rotated at a platen speed of 93 revolutions per minute; wherein the rotating head is rotated at a head speed of 87 revolutions per minute; wherein the substrate is pressed against the polishing surface of the polishing layer with a down force of 3 psi; wherein the polishing slurry is supplied to the polishing surface at a flow rate of 200 mL/min.

Preferably, the method of chemical mechanical polishing a substrate of the present invention, further comprises: providing a polishing machine having a rotating platen, a rotating head and a rotating conditioner; wherein the polishing layer is mounted to the rotating platen; wherein the substrate is secured to the rotating head; wherein the rotating platen is rotated at a platen speed of 93 revolutions per minute; wherein the rotating head is rotated at a head speed of 87 revolutions per minute; wherein the substrate is pressed against the polishing surface of the polishing layer with a down force of 3 psi; wherein the polishing slurry is supplied to the polishing surface at a flow rate of 200 mL/min; wherein the rotating conditioner is a diamond abrasive disk; wherein the polishing surface is abraded using the rotating conditioner; wherein the rotating conditioner is pressed against the polishing surface with a conditioner force of 7 lbs normal to the polishing surface.

The following examples illustrate the present invention without, however, being limited thereto.

EXAMPLES

Plaques comprising the reaction product of the reaction mixture formulations as set forth in Table 1, below, were formed by casting the indicated reaction mixtures, as set forth in Table 1, below, into polytetrafluorethylene (PTFE) coated rectangular flask as a mold 4⅞" (12.4 cm) wide×7½" (19.1 cm) long with a 1 cm opening and cavity to form plaques for mechanical testing. Example 1 and the Control used LF750D, a PTMEG based prepolymer from Lanxess, as the polyisocyanate prepolymer. Example 2 used a mixture of LF750D and Isonate™ 181, a modified methylene diphenyl diisocyanate (MDI) prepolymer from DOW, as the polyisocyanate prepolymer. The reaction mixtures were poured into the flask mold with a PTFE coated blade introduced prior to curing, thereby producing 2 plaques each of a thickness of from 0.065" (0.17 cm) to 0.090" (0.23 cm). Polishing layers comprising the reaction product of the reaction mixtures as set forth in Table 1, below, were drawn down onto a PTFE coated flat square aluminum plate having dimensions of at least 25" (63.5 cm)×25" (63.5 cm)×¼" (0.635 cm), followed by leveling off with a draw down bar, then cured and punched to make pads that have a 50.8 cm (20") diameter and a flat bottom which were then faced and grooved as discussed, below, for use in making polishing pads or polishing layers.

A two-component process was used to form each reaction mixture. The indicated polyisocyanate prepolymer or a mixture of polyisocyanates, and the optional microelements is one component. This component was heated to 65° C. to insure adequate flowability. The combined curative (e.g., MTEOA MeOSO3 and MBOCA) is another component. All three samples contained the same molar stoichiometry between combined curative and NCO as shown in Table 1. The two components were mixed together using a high shear mix head. After exiting the mix head, the reaction mixture was dispensed over a period of 2 to 5 minutes into the mold or onto the plate, and was allowed to gel for 15 minutes before placing the mold or plate in a curing oven. The indicated material was then cured in the curing oven using the following cycle: a 30 minutes ramp from ambient temperature to a set point of 104° C., then hold for 15.5 hours at 104° C., and then a 2-hour ramp from 104° C. to 21° C.

The material plaques molded from the indicated reaction mixtures in Examples 1 and 2 were analyzed to determine their zeta potential.

The cured polyurethane sheets were removed from the mold, and then faced and grooved (cut using a lathe) into an approximately 2.0 mm (80 mil) thick polishing layer having a 1010 groove pattern, with a groove depth of 0.76 mm. Each resulting polishing grooved polishing layer was then stacked onto a SP2150™ subpad (0.762 mm, polyurethane (PU) foam, Dow Chemical Company) using a pressure sensitive adhesive CRII™ platen adhesive to form a polishing pad. Pads thus prepared were used for the polishing studies.

Also shown in Table 1 is the matrix polymer modulus property, the modulus of the bulk polymer without expancel and porosity, of each sample. All three samples were shown to have comparable modulus and therefore having similar mechanical properties. Increasing the ionic content in a curative, or a mixture of curatives, has the effect of reducing the modulus of the resulting polymer. For Example 2, inclusion of Isonate™ 181 as an additional polyisocyanate prepolymer was necessary to offset the reduction of modulus from having an increased ionic content in the curative.

TABLE 1

| Sample | Prepolymer | Mol % MTEOA MeOSO3 in Curative | Mol % in MBOCA Curative | Curatives/ NCO (% mol) | SG of polishing layer with microelements (g/mL) | Matrix Polymer Modulus (psi) |
|---|---|---|---|---|---|---|
| Example 1 | LF750D | 25 | 75 | 105 | 0.95 | 51519 |
| Example 2 | LF750D/Isonate 181 (90/10 wt %) | 60 | 40 | 105 | 0.95 | 57508 |
| Control | LF750D | 0 | 100 | 105 | 0.95 | 50410 |

Zeta Potential

Pads were cut into a 1 inch diameter disks and mounted on a Teflon sample holder with double-sided tape. The samples were fixed to a shaft rotating at 4000 RPM and submerged into a 0.1 mM KCl solution at a 1 mm distance from the working electrode. Solution were kept at 25 C by a Peltier device.

Conductivity, pH, and temperature of the solution were measured independently and added manually in the software where the Zeta Potential of the sample is then calculated using the following equation:

$$\zeta \equiv \frac{1.96 \, kv^{1/2}}{\varepsilon \alpha \Omega^{3/2}} \frac{1}{2\left[1 - \frac{z}{a} - \frac{1}{2\left(\frac{z^2}{a^2} + 1\right)^{1/2}}\right]} \phi$$

Zeta potential values of example 1 and 2 at a pH of 5.5 are shown in Table 2 from 2 random locations of a single plaque.

Example 1 containing less than 50 mol % of MTEOA MeOSO3 in the curative, and its zeta potential values vary considerably more than those of Example 2 which has over 50 mol % of MTEOA MeOSO3. In order to have a stable polishing performance, the zeta potential needs to be consistent across the pad surface.

TABLE 2

| Sample | Measurement 1 (mV) | Measurement 2 (mV) |
| --- | --- | --- |
| Example 1 | 70 | 23 |
| Example 2 | 112 | 108 |

Zeta potential values of the control and Example 2 at pH of 3, 5.5, and 10 are shown in Table 3. The zeta potential of Example 2 is positive at every pH measured and varies minimally. The zeta potential of the control is found to be positive only at a pH of 3, and varies considerably across the pH range. Thus Example 2 has a stable positive charge that is stable across the pad and is not a function of pH.

TABLE 3

| Sample | Zeta Potential at pH 3 | Zeta Potential at pH 5.5 | Zeta Potential at pH 10 |
| --- | --- | --- | --- |
| Control | 15 | −30 | −100 |
| Example 2 | 105 | 112 | 109 |

Polishing

Polishing studies were performed on an Applied Materials Mirra™ polisher using Optiplane 2300™ (OP2300, from Dow Chemical Company), a positively charged acidic slurry diluted to 2 wt % abrasive, and Semi-Sperse™ 25 (SS25, from Cabot Microelectronics), a negatively charged alkaline slurry at a dilution of 1:3 slurry:DI water. A TEOS blanket wafer was used to determine removal rate (RR). Unless otherwise indicated (as platen rpm (PS)/carrier rpm (CS)), the polishing conditions used in all of the polishing experiments included a platen speed of 93 rpm; a carrier speed of 87 rpm; with a polishing medium flow rate of 150 mL/min and with the indicated down force (DF). The chemical mechanical polishing pads were each broken in with the conditioner using a down force of 3.2 kg (7 lbs) for 30 seconds. The polishing pads were further conditioned using a Saesol™ 8031C (AK45) diamond conditioning disk operating at a 3.2 kg (7 lb) down force and set for 100% in situ conditioning. The removal rates (RR) were determined by measuring the film thickness before and after polishing using a FX200 metrology tool (KLA-Tencor, Milpitas, Calif.) using a 49 point spiral scan with a 3 mm edge exclusion. The polishing layers were mounted onto the polishing platen of the indicated polisher using a double-sided pressure sensitive adhesive film.

Table 4 shows the removal rates of the Control and Example 2 at downforce of 3 and 5 psi. As shown in Table 4, Example 2 is superior to the Control at both downforces tested.

TABLE 4

| Sample | Slurry | RR at 3 psi Downforce (Å/mm) | RR at 5 psi Downforce (Å/mm) |
| --- | --- | --- | --- |
| Control | OP2300 | 2450 | 3490 |
| Example 2 | OP2300 | 3509 | 5451 |
| Control | SS25 | 1878 | 2937 |
| Example 2 | SS25 | 1931 | 3223 |

We claim:

1. A method of chemical mechanical polishing a substrate, comprising:
providing the substrate;
providing a polishing slurry comprising water and a silica abrasive;
providing a chemical mechanical polishing pad having a positive zeta potential, the polishing pad comprising a polishing layer having a composition, and a polishing surface, wherein the composition is a reaction product of ingredients, comprising:
(a) a polyfunctional isocyanate having an average of at least two unreacted isocyanate (NCO) groups per molecule;
(b) a first curative consisting of a hydroxyl substituted quaternary ammonium;
(c) a second curative, wherein said second curative is free of quaternary ammonium; and,
(d) optionally, a plurality of microelements;
wherein said first curative is present at equal to or greater than 50 mol % based on the total molar amount of the first curative and the second curative, and wherein the stoichiometric ratio of the combined reactive hydrogen groups in the curatives of (b) and (c) to the at least two unreacted isocyanate (NCO) groups in the polyfunctional isocyanate of (a) is 0.8 to 1.1; and
wherein said positive zeta potential is consistent across the surface of the entire polishing pad and is independent of pH over a pH range of 2 to 12 using nitric acid or potassium hydroxide to adjust pH of deionized water;
creating a dynamic motion between the polishing surface and the substrate to polish a surface of the substrate; and
dispensing the polishing slurry onto the chemical mechanical polishing pad at or near the interface between the polishing surface and the substrate.

2. The method of claim 1, wherein the first curative contains at least two hydroxyl groups per molecule.

3. The method of claim 1, wherein the first curative contains at least three hydroxyl groups per molecule.

4. The method of claim 3, wherein the second curative contains less than 0.1 wt % of tertiary amine.

5. The method of claim 1, wherein the second curative comprises an amine.

6. The method of claim 5, wherein the amine is an aromatic amine.

7. The method of claim 6, wherein the aromatic amine is 4,4'-methylenebis(2-chloroaniline) (MBOCA).

8. The method of claim 1, wherein the quaternary ammonium is tris(2-hydroxyethyl)methyl ammonium methyl sulfate.

9. The method of claim 1, wherein the silica abrasive has a positive surface charge measured at a polishing pH of 1 to 6.

10. The method of claim 1, wherein the polishing slurry has a pH of 3-5.

* * * * *